United States Patent
Fujibe et al.

(10) Patent No.: US 7,730,371 B2
(45) Date of Patent: Jun. 1, 2010

(54) TESTING DEVICE, TESTING METHOD, COMPUTER PROGRAM PRODUCT, AND RECORDING MEDIUM

(75) Inventors: Tasuku Fujibe, Tokyo (JP); Naoyoshi Watanabe, Tokyo (JP); Jun Hashimoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 157 days.

(21) Appl. No.: 12/046,467

(22) Filed: Mar. 12, 2008

(65) Prior Publication Data

US 2009/0077435 A1    Mar. 19, 2009

Related U.S. Application Data

(63) Continuation of application No. PCT/JP2006/316628, filed on Aug. 24, 2006.

(30) Foreign Application Priority Data

Sep. 14, 2005   (JP) ............................. 2005-267668

(51) Int. Cl.
*G11C 29/00* (2006.01)
*G01R 31/28* (2006.01)
*G01R 31/26* (2006.01)

(52) U.S. Cl. ................... 714/718; 714/710; 714/719; 714/743; 365/200; 365/201; 324/765

(58) Field of Classification Search ............... 714/718, 714/710, 719, 743; 365/200, 201; 324/765
See application file for complete search history.

(56) References Cited

U.S. PATENT DOCUMENTS

| | | | | |
|---|---|---|---|---|
| 4,797,886 A | * | 1/1989 | Imada | 714/718 |
| 4,998,025 A | * | 3/1991 | Watanabe | 327/141 |
| 5,682,390 A | * | 10/1997 | Housako et al. | 714/720 |
| 5,796,748 A | * | 8/1998 | Housako et al. | 714/720 |
| 5,831,989 A | * | 11/1998 | Fujisaki | 714/723 |
| 5,854,796 A | * | 12/1998 | Sato | 714/718 |
| 6,021,515 A | * | 2/2000 | Shimura | 714/738 |
| 6,425,095 B1 | * | 7/2002 | Yasui | 714/42 |
| 6,502,216 B1 | * | 12/2002 | Takano | 714/738 |
| 6,504,773 B2 | * | 1/2003 | Kobayashi | 365/201 |
| 6,513,138 B1 | * | 1/2003 | Ohsawa | 714/738 |
| 6,523,143 B1 | * | 2/2003 | Kobayashi | 714/718 |
| 6,571,353 B1 | * | 5/2003 | Sato | 714/7 |

(Continued)

FOREIGN PATENT DOCUMENTS

JP   2000-311500   11/2000

(Continued)

*Primary Examiner*—John J Tabone, Jr.
(74) *Attorney, Agent, or Firm*—Osha • Liang LLP (57) ABSTRACT

There is provided a test apparatus for testing a memory under test that is addressable by the number of pulses of an address signal supplied thereto. The test apparatus includes a pattern generating section that generates writing data to be written into the memory under test, a first address generating section having an address information storing section that stores thereon address information indicating an address of the memory under test to which the writing data is to be written, and a waveform shaping section that generates an address signal by outputting one or more pulses at a predetermined time interval during a time period determined in accordance with the address information stored on the address information storing section.

10 Claims, 10 Drawing Sheets

U.S. PATENT DOCUMENTS

| | | | |
|---|---|---|---|
| 6,836,863 B2 * | 12/2004 | Tabata et al. | 714/719 |
| 6,851,078 B2 * | 2/2005 | Takano | 714/718 |
| 6,880,117 B2 * | 4/2005 | Lin et al. | 714/718 |
| 7,079,971 B2 * | 7/2006 | Fukuda | 702/117 |
| 7,103,493 B2 * | 9/2006 | Kang et al. | 702/117 |
| 7,294,998 B2 * | 11/2007 | Chiba | 324/158.1 |
| 2002/0138799 A1 * | 9/2002 | Takano | 714/718 |
| 2005/0043912 A1 * | 2/2005 | Kang et al. | 702/117 |

FOREIGN PATENT DOCUMENTS

JP  2005-182866  7/2005

* cited by examiner

ADDRESS INFORMATION
STORING SECTION 34

| ADDRESS | ADDRESS INFORMATION |
|---------|---------------------|
| ⋮ | ⋮ |
| n | 3 |
| n+1 | 71 |
| n+2 | 229 |
| ⋮ | ⋮ |

ADDRESS INFORMATION
STORING SECTION 34

| ADDRESS | DATA |
|---|---|
| 0 ($2^0$) | 1 |
| 1 ($2^1$) | 0 |
| 2 ($2^2$) | 1 |
| 3 ($2^3$) | 1 |
| 4 ($2^4$) | 0 |
| 5 ($2^0$) | 0 |
| 6 ($2^1$) | 0 |
| 7 ($2^2$) | 1 |
| 8 ($2^3$) | 1 |
| 9 ($2^4$) | 1 |
| ⋮ | ⋮ |

Rows 0–4: ADDRESS INFORMATION A
Rows 5–9: ADDRESS INFORMATION B

TESTING DEVICE, TESTING METHOD, COMPUTER PROGRAM PRODUCT, AND RECORDING MEDIUM

CROSS REFERENCE TO RELATED APPLICATION

This is a continuation application of PCT/JP2006/316628 filed on Aug. 24, 2006, which claims priority from a Japanese Patent Application No. 2005-267668 filed on Sep. 14, 2005, the contents of which are incorporated herein by reference.

BACKGROUND

1. Technical Field

The present invention relates to a test apparatus and a test method for testing a memory under test, a computer program product to cause the test apparatus to function, and a recording medium. More particularly, the present invention relates to a test apparatus for testing a memory under test that is addressable by the number of pulses of an address signal supplied thereto.

2. Related Art

A known test apparatus designed to test a memory under test such as a semiconductor memory tests a plurality of memories under test concurrently. The test apparatus judges whether the individual addresses are acceptable in each memory under test, and stores thereon the judgment results of the individual addresses.

Referring to memories under test of a certain type, it is necessary to write unique data into each memory under test in accordance with the judgment results of the individual addresses. Such data is different among the memories under test that have been tested. This is the reason why the test apparatus has a plurality of memories in a one-to-one correspondence with the memories under test for storing the above-mentioned data for the corresponding memory under test. Each of the memories in the test apparatus stores data used to repair a defective address in the corresponding memory under test, data indicating manufacturing information, and the like.

Each of such memories in a conventional test apparatus has a memory that stores 1-bit data at each address thereof and an address pointer that sequentially designates the address in the memory. For example, when the test apparatus applies a pattern "101101" to one of the memories under test, the corresponding memory in the test apparatus stores the individual bit values of the pattern at different addresses. The corresponding memory in the test apparatus uses the address pointer to sequentially designate the respective addresses, to output the pattern.

Memories under test of a certain type are addressable for the repairing processing by the number of pulses of a signal supplied to a particular pin during the defective address repairing processing. Note that each memory under test has different addresses which should be subjected to the repairing processing. Therefore, the information indicating such addresses is stored on a corresponding one of the memories which are provided in the test apparatus in a one-to-one correspondence with the memories under test.

As mentioned above, the address signal is stored on the corresponding memory in the test apparatus. Here, note that the memories in the conventional test apparatus store 1-bit data at each address thereof. Therefore, the individual bit values of the address signal need to be stored on different addresses. For example, when the test apparatus performs the repairing processing on the address No. 32760 in one of the devices under test, the corresponding memory in the test apparatus is required to have at least 32760 addresses. This indicates that the test apparatus needs memories with a very large storage capacity.

Furthermore, the address signal indicating the address to be repaired needs to be generated based on the results of judging whether the individual addresses in each memory under test are acceptable and the generated address signal needs to be stored on the corresponding memory in the test apparatus. Here, the address signal needs to be stored on multiple addresses as mentioned above. Therefore, it takes a long time to store the address signal onto the corresponding memory in the test apparatus.

Therefore, it is an object of an aspect of the innovations herein to provide a test apparatus, a test method, a computer program product, and a recording medium, which are capable of overcoming the above drawbacks accompanying the related art. The above and other objects can be achieved by combinations described in the independent claims. The dependent claims define further advantageous and exemplary combinations of the innovations herein.

SUMMARY

According to the first aspect related to the innovations herein, one exemplary test apparatus may include a test apparatus for testing a memory under test that is addressable by the number of pulses of an address signal supplied thereto. The test apparatus includes a pattern generating section that generates writing data to be written into the memory under test, a first address generating section that has an address information storing section storing thereon address information indicating an address of the memory under test to which the writing data is to be written, and a waveform shaping section that generates an address signal by outputting one or more pulses at a predetermined time interval during a time period determined in accordance with the address information stored on the address information storing section.

The address information storing section may store thereon the address information indicating an expected number of pulses of the address signal. The first address generating section may include a down counter that subtracts, at a predetermined time interval, a first predetermined value from the number of pulses indicated by the address information received from the address information storing section, and a signal output section that outputs a pulse signal having a pulse width substantially equal to a time period from when the down counter receives the address information to when a result of the subtraction done by the down counter reaches a second predetermined value. The waveform shaping section may generate the one or more pulses at the predetermined time interval during the time period for which the pulse signal indicates a predetermined logic value.

When the test apparatus writes repairing data into a defective address in the memory under test, the defective address of the memory under test to which the repairing data is to be written may be designated by the number of the pulses of the address signal supplied to the memory under test. When the test apparatus tests each address of the memory under test, the pattern generating section may generate test data as the writing data, and when the test apparatus repairs the defective address in the memory under test, the pattern generating section may generate the repairing data as the writing data. The test apparatus may further include a second address generating section that generates an address signal which sequentially designates each address of the memory under test to which the test data is to be written, and an address selecting section that (i), when the test apparatus tests each address of the memory under test, selects the address signal generated by the second address generating section and supplies the selected address signal to the memory under test and (ii), when the test apparatus repairs the defective address in the memory under test, selects the address signal generated by the first address generating section and supplies the selected address signal to the memory under test.

The test apparatus may further include a judging section that reads the test data which has been written into each address of the memory under test, and judges whether each address is acceptable based on the read data. Here, the address information storing section may store thereon the address information indicating an address judged by the judging section to be the defective address.

The address information storing section may store thereon binary data indicating an expected number of pulses of the address signal. The first address generating section may further include an address pointer that maintains designation of each of bit values of the binary data for a time period determined in accordance with a bit position of the designated bit value, so as to cause the address information storing section to keep outputting the designated bit value for the time period. The waveform shaping section may generate the address signal by outputting the one or more pulses at the predetermined time interval during the time period in which a signal output from the address information storing section indicates a predetermined logic value.

The address information storing section may store each of the bit values of the binary data at a different address thereof, and the address pointer may maintain designation of each address of the address information storing section for a time period determined in accordance with a bit position of a bit value stored on the designated address, so as to cause the address information storing section to keep outputting the bit value stored on the designated address for the time period.

The address pointer may include a clock terminal that receives a reference clock, a hold terminal that receives a hold instruction to cause the address pointer to hold designation of an address number, and an increment terminal that receives an increment instruction that, on condition that the address pointer does not receive the hold instruction, sequentially increases the designated address number in accordance with the reference clock. Here, the test apparatus may further include an increment instruction generating section that supplies, to the address pointer as the increment instruction, a pulse sequence including a plurality of pulses each of which has a pulse width equal to an integral multiple of a period of the reference clock, where the pulse width of each of the plurality of pulses is twice the pulse width of an immediately preceding pulse, and a hold instruction generating section that supplies, to the address pointer as the hold instruction, a pulse sequence including a plurality of pulses which are respectively synchronized with the plurality of pulses of the increment instruction, where each of the plurality of pulses has a pulse width smaller than a pulse width of a corresponding one of the plurality of pulses of the increment instruction by a duration equal to the period of the reference clock.

According to the second aspect related to the innovations herein, one exemplary test method may include a test method for testing a memory under test that is addressable by the number of pulses of an address signal supplied thereto. The test method includes generating writing data to be written into the memory under test, storing address information indicating an address of the memory under test to which the writing data is to be written, and a waveform shaping section that generates an address signal by outputting one or more pulses at a predetermined time interval during a time period determined in accordance with the address information stored in the address information storing.

According to the third aspect related to the innovations herein, one exemplary computer program product may include a computer program product for use with a test apparatus that tests a memory under test that is addressable by the number of pulses of an address signal supplied thereto. The computer program product has computer instructions, recorded on a computer readable medium for enabling a computer to execute the computer instructions to cause the test apparatus to function as a pattern generating section that generates writing data to be written into the memory under test, a first address generating section that stores thereon address information indicating an address of the memory under test to which the writing data is to be written, and a waveform shaping section that generates an address signal by outputting one or more pulses at a predetermined time interval during a time period determined in accordance with the address information stored on the first address generating section.

According to the fourth aspect related to the innovations herein, one exemplary recording medium may include a recording medium storing thereon a program for use with a test apparatus that tests a memory under test that is addressable by the number of pulses of an address signal supplied thereto. The program causes the test apparatus to function as a pattern generating section that generates writing data to be written into the memory under test, a first address generating section that stores thereon address information indicating an address of the memory under test to which the writing data is to be written, and a waveform shaping section that generates an address signal by outputting one or more pulses at a predetermined time interval during a time period determined in accordance with the address information stored on the first address generating section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
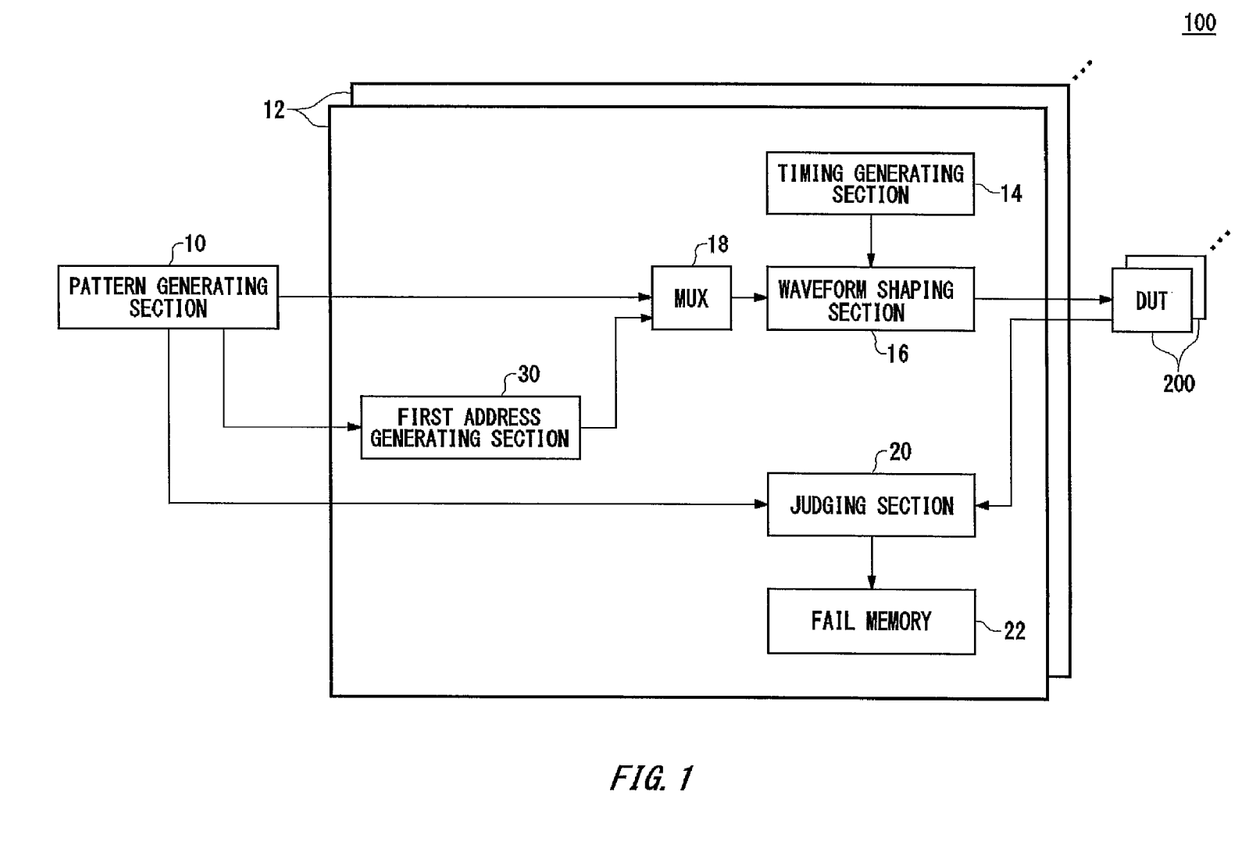
FIG. 1 illustrates an exemplary configuration of a test apparatus 100 relating to an embodiment of the present invention.

FIG. 1 illustrates an exemplary configuration of a test apparatus 100 relating to an embodiment of the present invention. The test apparatus 100 is a test apparatus designed to test a memory under test 200. The test apparatus 100 includes therein a pattern generating section 10 and a test board 12. Here, the test apparatus 100 may test a plurality of memories under test 200 in parallel. If such is the case, the test apparatus 100 may include therein a plurality of test boards 12 in a one-to-one correspondence with the memories under test 200. The test board 12 includes therein a first address generating section 30, an address selecting section 18, a timing generating section 14, a waveform shaping section 16, a judging section 20 and a fail memory 22.

The test apparatus 100 operates in an operation mode of judging whether each address of the memory under test 200 is acceptable, or in an operation mode of repairing a defective address in the memory under test 200. The following description starts with explaining the operation mode in which the test apparatus 100 judges whether each address of the memory under test 200 is acceptable.

The pattern generating section 10 is configured to generate writing data to be written into the memory under test 200. For example, when the test apparatus 100 tests each address in the memory under test 200, the pattern generating section 10 generates, as the writing data, test data to be written into each address of the memory under test 200.

While the test apparatus 100 is in this operation mode, the pattern generating section 10 also functions as a second address generating section that generates an address in the memory under test 200 to which each piece of test data is to be written. The pattern generating section 10 generates each address and a corresponding piece of test data in synchronization with each other. When the test apparatus 100 tests the memory under test 200, the address selecting section 18 selects the addresses generated by the pattern generating section 10, and supplies the selected addresses to the waveform shaping section 16. The waveform shaping section 16 also receives the writing data generated by the pattern generating section 10.

The test board 12 may be provided in correspondence with each pin of the memory under test 200. If such is the case, the pattern generating section 10 may supply the address signal to a test board 12 associated with the address pin of the memory under test 200, and may supply the writing data to a test board 12 associated with the data pin of the memory under test 200. Alternatively, a single test board 12 may be configured to include a waveform shaping section 16 associated with the address pin and another waveform shaping section 16 associated with the data pin.

The waveform shaping section 16 associated with the data pin generates a test signal to be input into the memory under test 200 based on the received writing data. For example, the waveform shaping section 16 generates a test signal indicating voltage values determined by the data values of the writing data in accordance with the timing clock supplied thereto from the timing generating section 14. The waveform shaping section 16 in accordance with the address pin supplies the received address signal to the memory under test 200 in synchronization with the test signal. In the above-described manner, the test apparatus 100 writes predetermined data into each of the addresses of the memory under test 200.

The judging section 20 reads the data that has been written into each of the addresses in the memory under test 200 and compares the read data with expected value data, so as to judge whether each address of the memory under test 200 is acceptable. For example, the judging section 20 compares the data read from the memory under test 200 with the expected value data supplied thereto from the pattern generating section 10. The pattern generating section 10 may supply to the judging section 20, as the expected value data, the same data as the writing data that has been written into the memory under test 200.

The fail memory 22 stores thereon the result of the judgment made by the judging section 20, in association with each address of the memory under test 200. With this configuration, the test apparatus 100 can perform an analysis to identify which of the addresses of the memory under test 200 are defective.

The following describes the operation mode in which the test apparatus 100 repairs the defective address in the memory under test 200. While the test apparatus 100 is in this operation mode, the pattern generating section 10 supplies address information identifying the defective address to the first address generating section 30 in the test board 12 associated with the address pin of the memory under test 200. The address information identifying the defective address can be easily generated based on the judgment results stored on the fail memory 22.

When the memory under test 200 receives the signal designating the address to be repaired at a special pin different from the normal address pin, the pattern generating section 10 may supply the address information identifying the defective address to the first address generating section 30 provided in the test board 12 associated with the special pin. The pattern generating section 10 also supplies the data to be written into the defective address, to the test board 12 associated with the data pin of the memory under test 200. This data may be the same among a plurality of memories under test 200.

The first address generating section 30 generates an address signal identifying the address of the memory under test 200 which are to be repaired. The first address generating section 30 prestores thereon the address information identifying the defective address, and generates the address signal based on the prestored address information. The generated address signal has pulses the number of which is determined by the defective address, as mentioned above. The first address generating section 30 provided in the test board associated with the address or special pin of each memory under test 200 is supplied in advance with the address information generated based on the results of the judgment made on the memory under test 200.

The address selecting section 18 selects the address signal generated by the first address generating section 30, and supplies the selected address signal to the waveform shaping section 16. The waveform shaping section 16 shapes the address signal and supplies the shaped address signal to the memory under test 200. In the above-described manner, the test apparatus 100 can designate a defective address in each memory under test 200, and write common repairing data into each memory under test 200.

Figure 2:
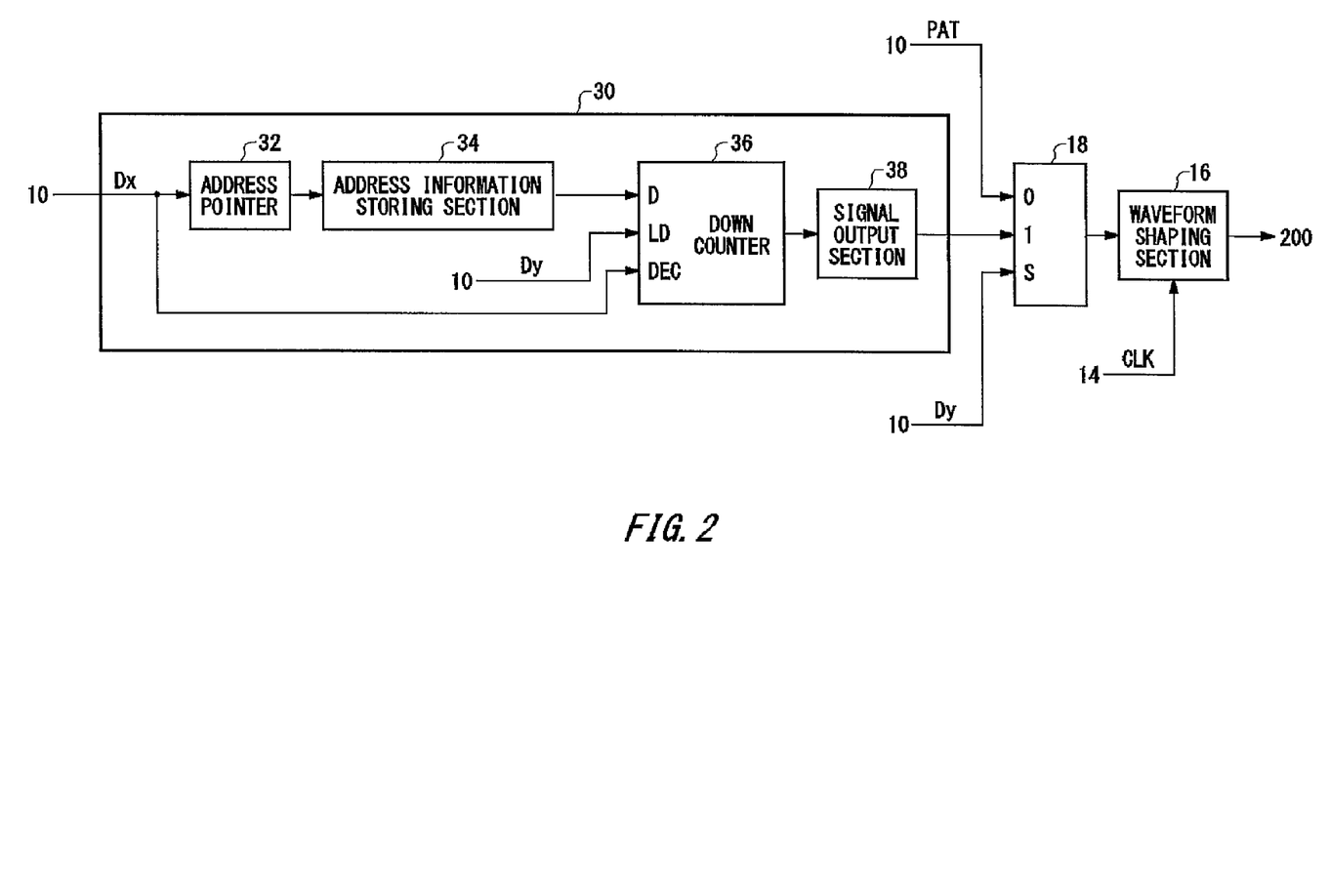
FIG. 2 illustrates an exemplary configuration of a first address generating section 30.

FIG. 2 illustrates an exemplary configuration of the first address generating section 30. The first address generating section 30 includes therein an address pointer 32, an address information storing section 34, a down counter 36, and a signal output section 38.

The address information storing section 34 prestores thereon the address information identifying the address judged by the judging section 20 to be defective. Here, the address information indicates the expected number of pulses of the address signal that designates the defective address. For example, when the address No. 32760 is judged to be defective, the address information storing section 34 stores, on a single address thereof, numerical data indicating "32760". When the memory under test 200 has more than one defective address, the address information storing section 34 stores, on a different address thereof, the address information designating each defective address.

The address pointer 32 sequentially designates a different address of the address information storing section 34 and notifies the address information storing section 34 of the designated address, in correspondence with a signal Dx supplied thereto from the pattern generating section 10. Based on the notification, the address information storing section 34 sequentially outputs the address information indicating each defective address, in accordance with the signal Dx.

The down counter 36 subtracts a first predetermined value from the number of pulses which is indicated by the address information received from the address information storing section 34 at a predetermined time interval, and outputs the result of the subtraction. The predetermined time interval may be set equal to, for example, the period of the reference clock CLK output from the timing generating section 14. The first predetermined value may be set at one, for example. The timing at which the down counter 36 loads the address value output from the address information storing section 34 is controlled by a signal Dy supplied to the down counter 36 from the pattern generating section 10. The timing at which the down counter 36 starts subtracting the first predetermined value from the loaded address value is controlled by the signal Dx supplied to the down counter 36 from the pattern generating section 10.

In an exemplary case where the defective address to be repaired is the address No. 32760, the down counter 36 outputs the value "0" as the result of the subtraction when a time period that is 32760 times the period of the reference clock has elapsed from when the down counter 36 loads the address value and starts the subtraction.

The signal output section 38 receives the result of the subtraction done by the down counter 36, and outputs a signal corresponding to the subtraction result. According to the present example, the signal output section 38 outputs a pulse signal having a pulse width substantially equal to the time period from when the down counter 36 starts the subtraction to when the down counter 36 outputs the value "0" as the subtraction result.

When the test apparatus 100 repairs the defective address, the address selecting section 18 selects the signal output from the first address generating section 30, and supplies the selected signal to the waveform shaping section 16. According to the present example, the address selecting section 18 selects one of the address signal generated by the pattern generating section 10 and the signal output from the first address generating section 30, and supplies the selected signal to the waveform shaping section 16. The selection made by the address selecting section 18 between these signals is controlled by the signal Dy generated by the pattern generating section 10.

When the test apparatus 100 repairs the defective address, the waveform shaping section 16 receives the pulse signal output from the first address generating section 30. During a time period for which the received pulse signal indicates a predetermined logic value, the waveform shaping section 16 generates and outputs pulses at a predetermined time interval. For example, the predetermined logic value may be the logic value "1", and the predetermined interval may be equal to the period of the reference clock generated by the timing generating section 14. The waveform shaping section 16 may output a logical OR between the received pulse signal and the reference clock, for example.

With the above-described configuration, the first address generating section 30 can generate the address signal having pulses the number of which is determined by the address information stored on the address information storing section 34. Since the address information storing section 34 stores address information indicating a single defective address on a single address thereof, the address information storing section 34 can be implemented by a reduced memory capacity.

Figure 3:
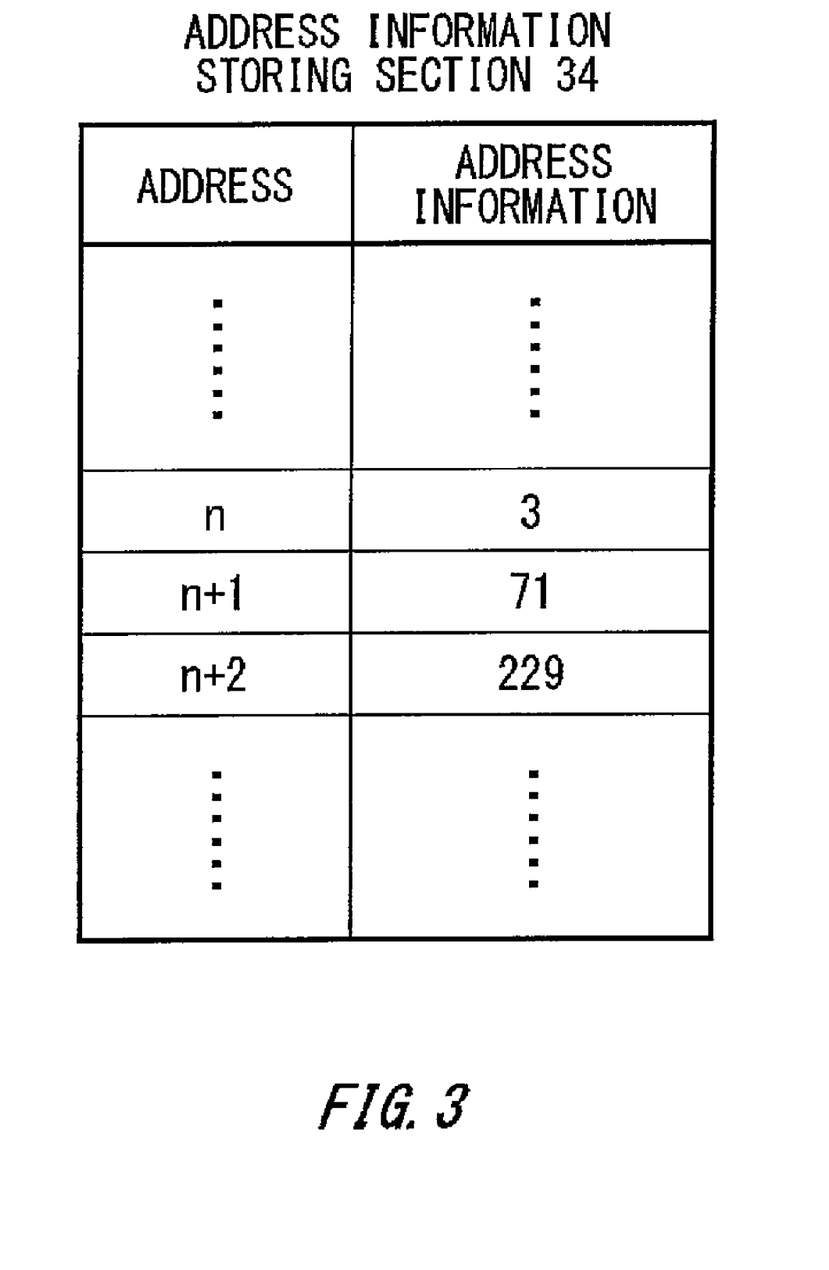
FIG. 3 illustrates, as an example, address information stored on an address information storing section 34.

FIG. 3 illustrates, as an example, the address information stored on the address information storing section 34. As described earlier, the address information storing section 34 stores, on each address thereof, address information identifying a single defective address. Specifically speaking, the address information indicates the address value of a defective address. The down counter 36 defines the time period corresponding to the address value indicated by the address information, and the signal output section 38 generates a pulse signal having a pulse width substantially equal to the defined time period. The waveform shaping section 16, for example, outputs a logical OR between the generated pulse signal and the reference clock thereby generating the address signal having pulses the number of which is determined by the address value of the defective address.

Figure 4:
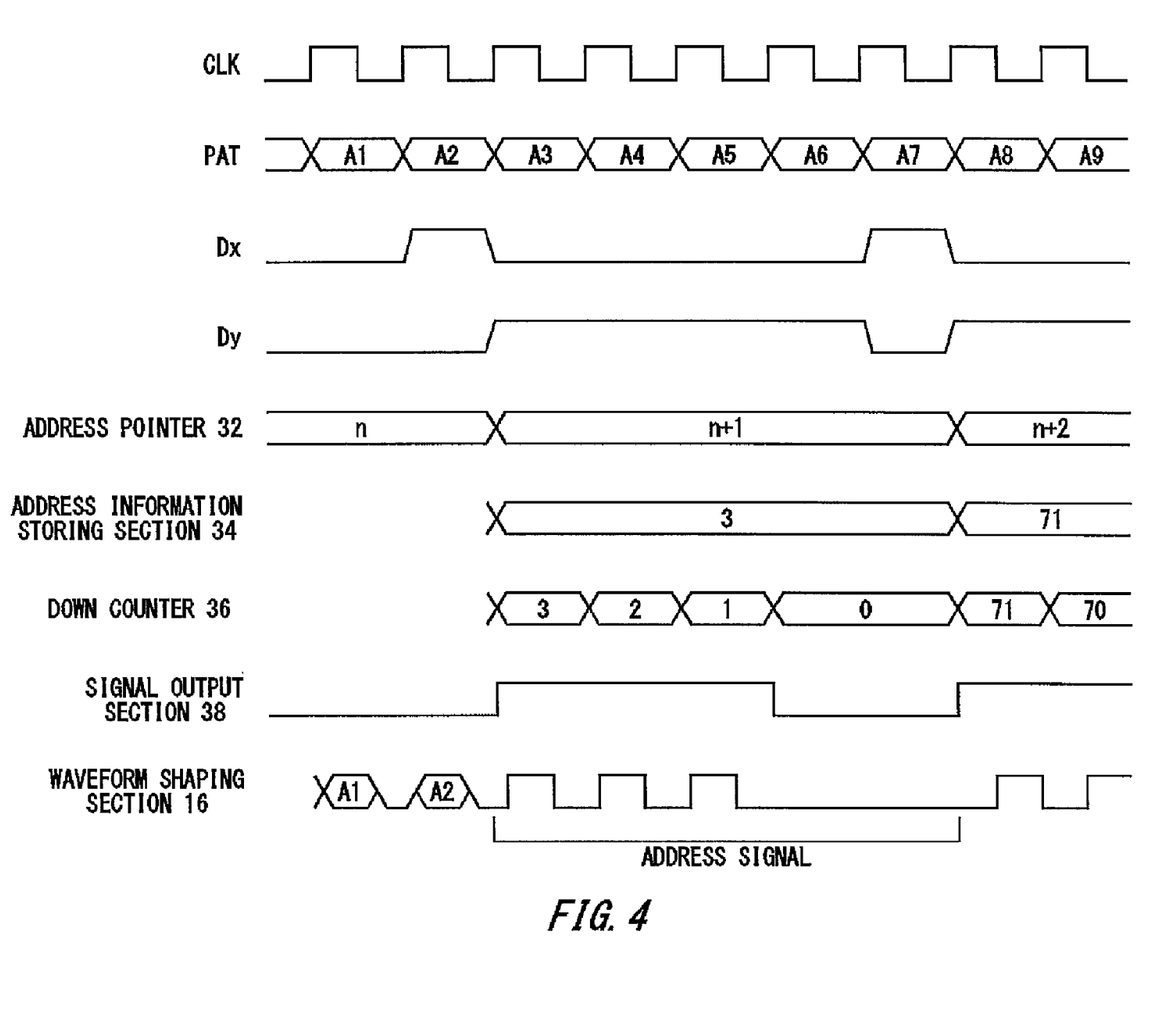
FIG. 4 is a timing chart illustrating an exemplary operation of the test apparatus 100.

FIG. 4 is a timing chart illustrating an exemplary operation of the test apparatus 100. According to the present exemplary operation, the test apparatus 100 is desired to repair an address No. 3 in a memory under test 200 and therefore generates an address signal designating this address No. 3.

The timing generating section 14 generates the reference clock CLK having a predetermined period. The address pointer 32 holds thereon an address to be designated within the address information storing section 34, that is to say, an address value n. The address pointer 32 designates the address held thereon, within the address information storing section 34, in accordance with the signal Dx supplied thereto from the pattern generating section 10, adds one to the held address, and newly holds thereon the resulting address. According to the present example, the address information storing section 34 stores, on the address n thereof, address information "3".

The address information storing section 34 outputs the data stored on the address thereof designated by the address pointer 32. According to the present example, the address information storing section 34 outputs the data indicating "3" which is stored on the address n thereof.

The down counter 36 loads the data output from the address information storing section 34, in accordance with the signal Dy supplied thereto from the pattern generating section 10. The down counter 36 subtracts one from the value indicated by the loaded data at a time interval equal to the period of the reference clock CLK. When the result of the subtraction becomes equal to zero, the down counter 36 outputs the value zero until loading new data from the address information storing section 34.

The signal output section 38 outputs a pulse signal having a pulse width substantially equal to the time period from when the down counter 36 starts the subtraction to when the down counter 36 outputs the value "0" as the subtraction result. The signal output section 38 may receive the signal Dy, and use the signal Dy to detect the timing at which the down counter 36 starts the subtraction. According to the present example, the signal output section 38 outputs a pulse signal having a pulse width that is substantially three times the period of the reference clock CLK.

The waveform shaping section 16 outputs pulses at a time interval substantially equal to the period of the reference clock CLK, during the time period for which the pulse signal received from the signal output section 38 indicates the logic value "1". According to the present example, since the received pulse signal has a pulse width three times the period of the reference clock CLK, the waveform shaping section 16 outputs three pulses as an address signal. In the above-described manner, the test apparatus 100 can generate an address signal having a desired number of pulses.

Figure 5:
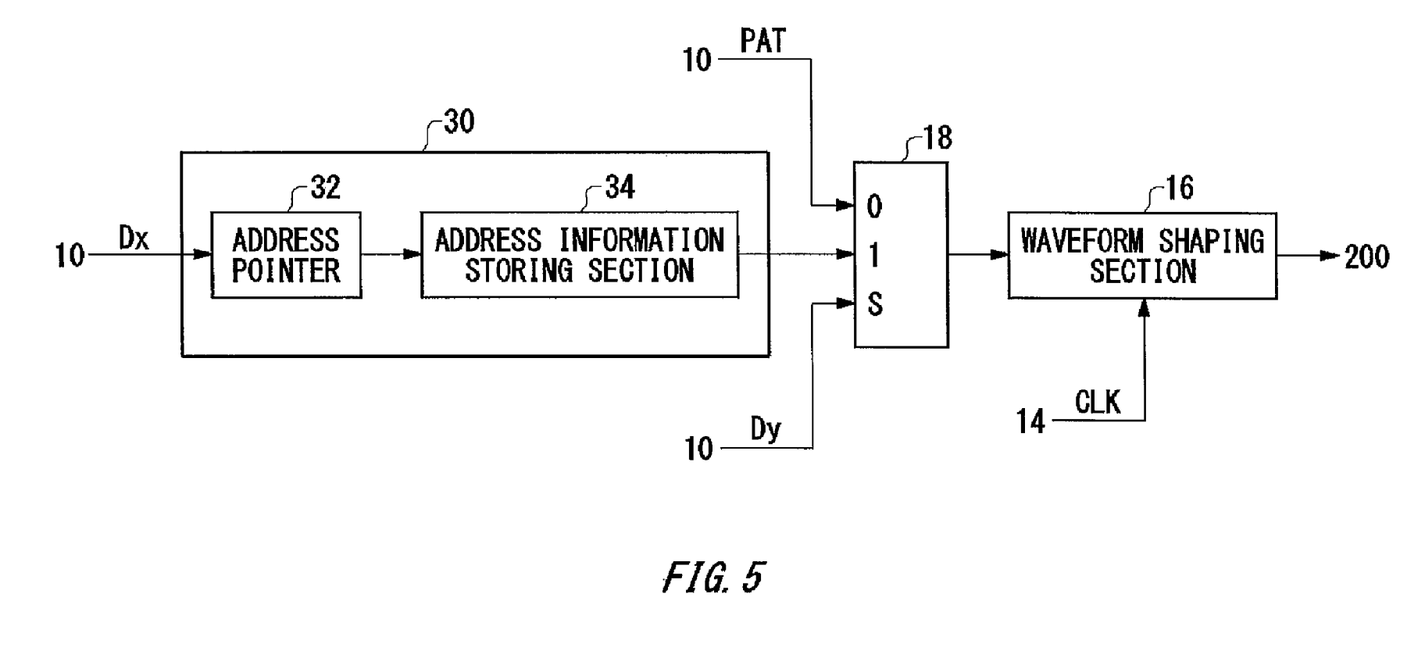
FIG. 5 illustrates a different exemplary configuration of the first address generating section 30.

FIG. 5 illustrates a different exemplary configuration of the first address generating section 30. According to the present example, the first address generating section 30 has the address pointer 32 and the address information storing section 34. The address information storing section 34 stores thereon binary data indicating the expected number of pulses of an address signal which designates a defective address.

The address pointer 32 maintains the designation of each bit value of the binary data for a time period determined by the bit position of the designated bit value, and causes the address information storing section 34 to output the designated bit value for the time period. For example, the address information storing section 34 stores each of the bit values of the binary data on a different address thereof. The address pointer 32 maintains the designation of each address of the address information storing section 34 for a time period determined by the bit position of the bit value stored on the designated address. In this manner, the address pointer 32 causes the address information storing section 34 to output each bit value for a corresponding time period.

The waveform shaping section 16 generates an address signal by outputting pulses at a predetermined time interval during the time period in which the signal output from the address information storing section 34 indicates a predetermined logic value. For example, the predetermined logic value may be the logic value "1", and the predetermined time interval may be equal to the period of the reference clock generated by the timing generating section 14.

Figure 6:
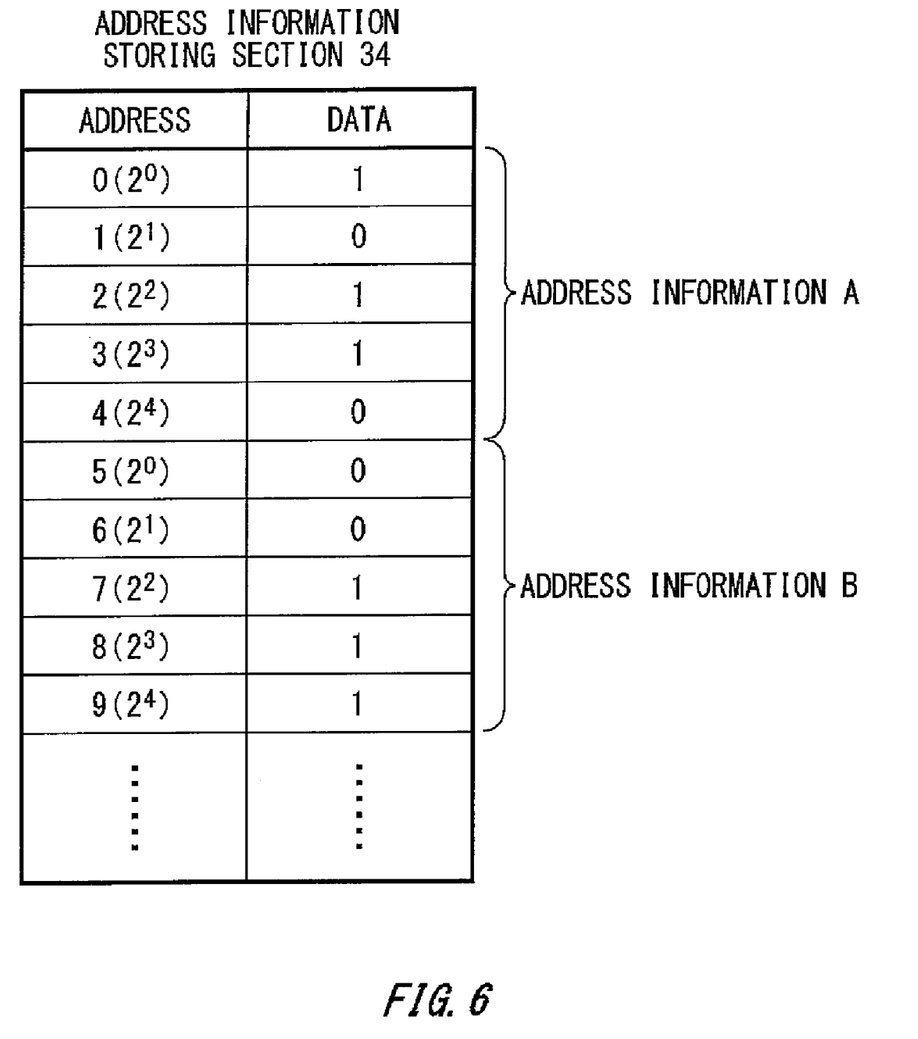
FIG. 6 illustrates, as an example, the address information stored on the address information storing section 34 of FIG. 5.

FIG. 6 illustrates, as an example, the address information stored on the address information storing section 34 of FIG. 5. According to the present example, the address information storing section 34 stores each of the bit values of the binary data (i.e. the address information) on a different address thereof. When this configuration is adopted, the address information storing section 34 is divided into a plurality of blocks each of which has a predetermined number of addresses, so that each of the blocks stores one piece of address information.

According to the present example, the address information storing section 34 is divided into the blocks each having five addresses. In this case, the address information storing section 34 can store, on each block thereof, the address information indicating the address value ($2^5-1$). The number of addresses forming each block is preferably set so that each block is capable of storing the maximum value among the address values of the memory under test 200.

As discussed above, the address pointer 32 maintains the designation of each address of the address information storing section 34 for the time period determined by the bit position of the binary data stored on the designated address. Take as an example an address of the address information storing section 34 which stores thereon a bit value associated with a bit position of m-th power of 2. In this case, the address pointer 32 maintains the designation of this address for the time period that is (m-th power of 2) times the period of the reference clock.

Figure 7:
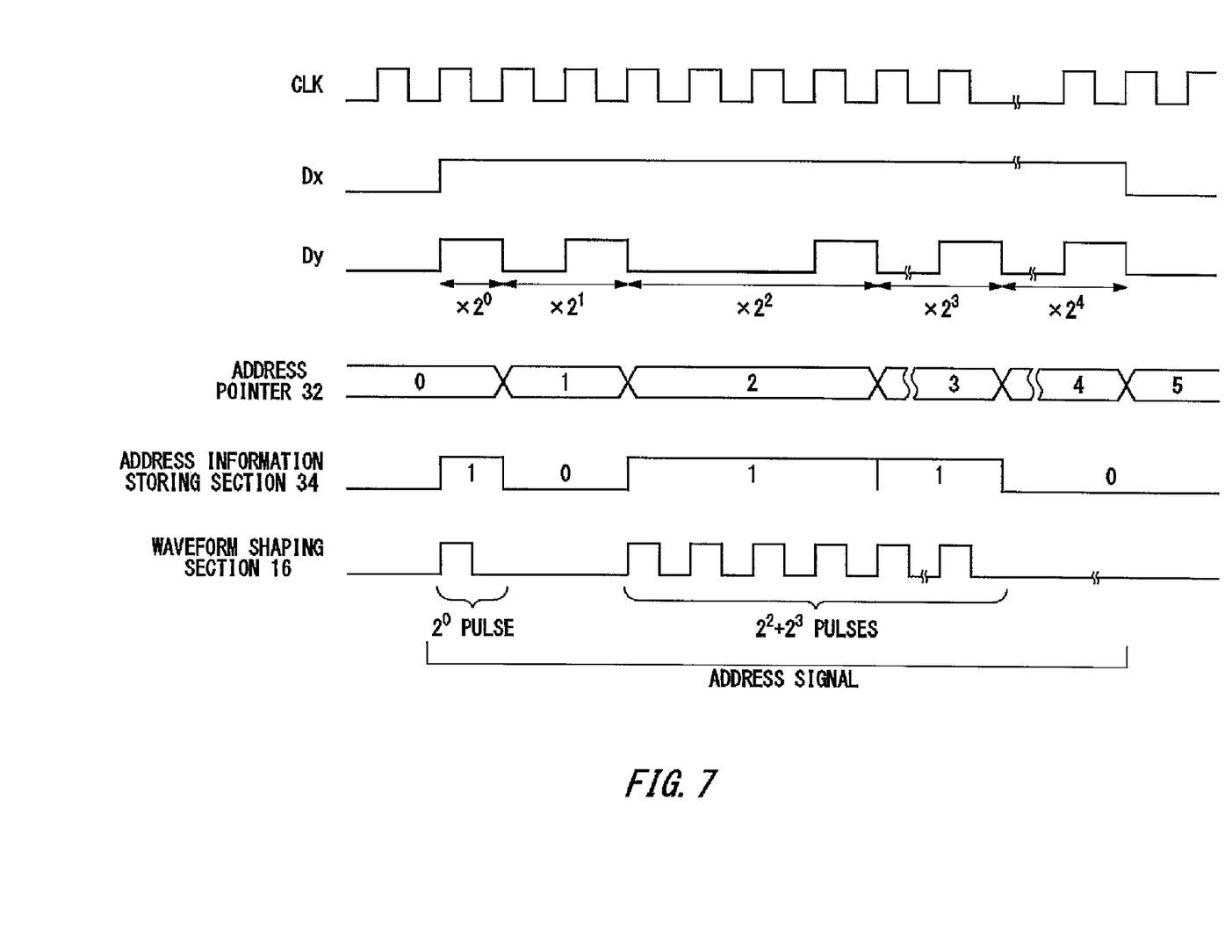
FIG. 7 is a timing chart illustrating an exemplary operation of the test apparatus 100 configured by using the first address generating section 30 shown in FIG. 5.

FIG. 7 is a timing chart illustrating an exemplary operation of the test apparatus 100 configured by using the first address generating section 30 shown in FIG. 5. According to the present exemplary operation, the test apparatus 100 is desired to repair an address No. 13 of a memory under test 200, and thus generates an address signal designating the address No. 13. In this case, the binary data of the address information is represented as "10110".

The timing generating section 14 generates the reference clock CLK having a predetermined period. When initialized, the address pointer 32 holds an address value "0" as the address to be designated in the address information storing section 34. The address pointer 32 designates the address value held thereon, within the address information storing section 34, in accordance with the signal Dx supplied thereto from the pattern generating section 10, adds one to the held address, and newly holds the resulting address thereon.

Here, the pattern generating section 10 generates the signal Dx in which each pulse has a period twice the period of the immediately preceding pulse, as shown in FIG. 7. For example, the pattern generating section 10 generates the signal Dx whose pulse periods are respectively $2^0$ times, $2^1$ times, $2^2$ times, ... the period of the reference clock. Also, the pattern generating section 10 supplies the signal Dy to the address selecting section 18 so that the address selecting section 18 selects the address generated by the first address generating section 30 while the test apparatus 100 is performing the repairing processing.

The address pointer 32 increases, by one, the address to be designated in the address information storing section 34, in accordance with the pulses of the signal Dx. Here, since each of the pulses of the signal Dx has a period twice the period of the immediately preceding pulse, the time period for which the address pointer 32 maintains the designation of each address of the address information storing section 34 is twice the time period for which the address pointer 32 maintains the designation of the address preceding by one.

The address information storing section 34 keeps outputting the data stored on the designated address, for the time period during which the address pointer 32 maintains the designation of the address. When controlled in this manner, the address information storing section 34 keeps outputting the binary data value of the address information which is stored on each address, for a time period weighted in accordance with the bit position of the data value stored on the address.

The waveform shaping section 16 outputs pulses at a time interval substantially equal to the period of the reference clock CLK during a time period in which the data output from the address information storing section 34 indicates the logic value "1". According to the present example, the total duration of the time periods during which the data output from the address information storing section 34 indicates the logic value "1" is 13 times the period of the reference clock CLK. Therefore, the waveform shaping section 16 outputs 13 pulses as the address signal. In the above-described manner, the test apparatus 100 can generate an address signal having a desired number of pulses.

According to the present example, the address information storing section 34 stores 1-bit data on each address thereof. Therefore, the test apparatus 100 can generate the address signal for the repairing processing with the use of memories which are configured in the same manner as the memories provided in the conventional test apparatus. Additionally, the test apparatus 100 can generate the address signal without using the down counter and the like. Which is to say, the test apparatus 100 can easily generate the address signal for the repairing processing by making use of the configuration of the conventional test apparatus.

Figure 8:
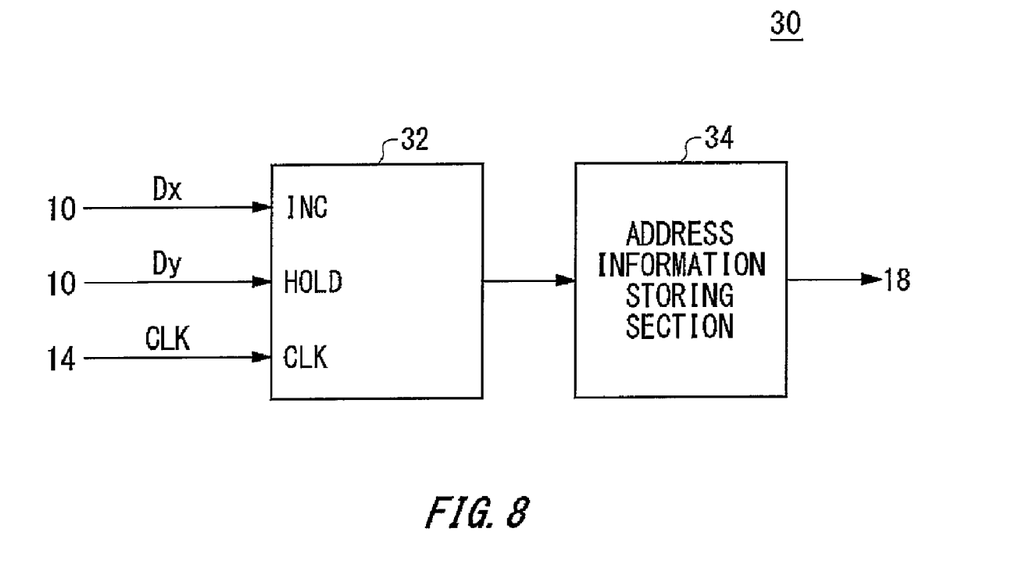
FIG. 8 illustrates a further different exemplary configuration of the first address generating section 30.

FIG. 8 illustrates a further different exemplary configuration of the first address generating section 30. When the first address generating section 30 relating to the present example is used, the address selecting section 18 and the waveform shaping section 16 operate in the same manner as described with reference to FIGS. 6 and 7. According to the present example, the address information storing section 34 is the same as described with reference to FIG. 6.

According to the present example, the first address generating section 30 includes therein the address pointer 32 and the address information storing section 34. The address pointer 32 has a clock terminal (CLK), a hold terminal (HOLD), and an increment terminal (INC).

The clock terminal receives the reference clock generated by the timing generating section 14. The hold terminal receives a hold instruction (the signal Dy) from the pattern generating section 10. When receiving the hold instruction, the address pointer 32 keeps the designation of the address number in the address information storing section 34, without changing the designation.

The increment terminal receives an increment instruction (the signal Dx) from the pattern generating section 10. When receiving the increment instruction, the address pointer 32 sequentially increases the address number designated in the address information storing section 34 in accordance with the reference clock, on condition that the address pointer 32 does not receive the hold instruction.

When the test apparatus 100 performs the repairing processing, the pattern generating section 10 functions as an increment instruction generating section that supplies, to the address pointer 32 as the increment instruction, a pulse sequence having a plurality of pulses each of which has a pulse width equal to the integral multiple of the period of the reference clock. Here, the pulse sequence is configured in such a manner that the pulse width of each pulse is twice the width of the immediately preceding pulse. Also, the pattern generating section 10 functions as a hold instruction generating section that supplies, to the address pointer 32 as the hold instruction, a pulse sequence having a plurality of pulses synchronized with the respective pulses of the increment instruction. Here, the pulse sequence is configured in such a manner that the pulse width of each pulse is smaller, by the duration equal to the period of the reference clock than the pulse width of the corresponding pulse in the increment instruction.

With the above-described configuration, the first address generating section 30 relating to the present example can output the same signal as the first address generating section 30 described with reference to FIG. 5. Which is to say, the first address generating section 30 relating to the present example can supply, to the waveform shaping section 16, the signal whose logic value indicates "1" for the time period determined in accordance with the address information stored on the address information storing section 34.

Figure 9:
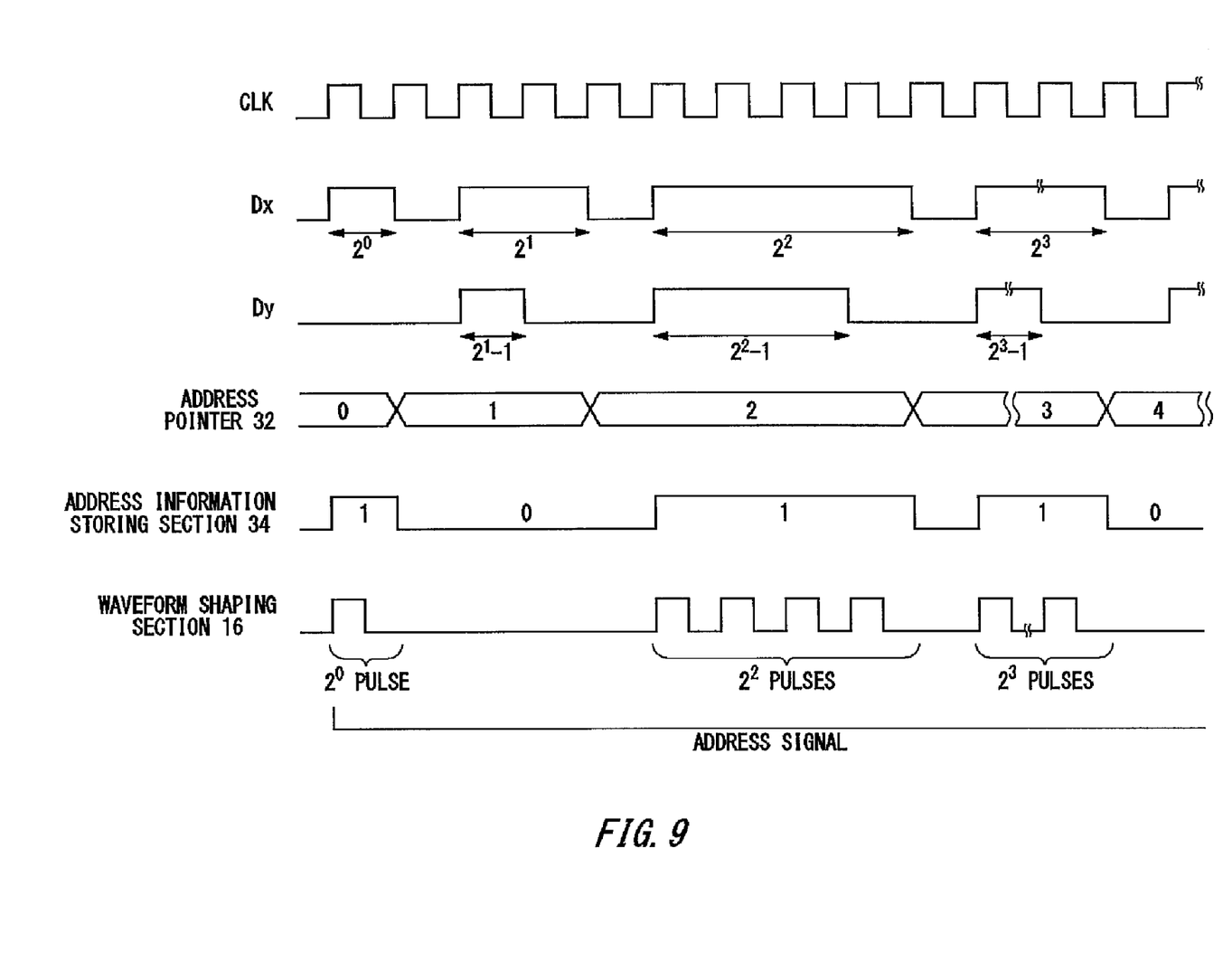
FIG. 9 is a timing chart illustrating an exemplary operation of the test apparatus 100 configured by using the first address generating section 30 shown in FIG. 8.

FIG. 9 is a timing chart illustrating an exemplary operation of the test apparatus 100 configured by using the first address generating section 30 shown in FIG. 8. As discussed above, the increment instruction (the signal Dx) is a pulse sequence in which the pulse width of each pulse is twice the pulse width of the immediately preceding pulse. Therefore, the first address generating section 30 can generate a signal whose logic value indicates "1" for the time period corresponding to the address information, by increasing the address designated. In the address information storing section 34 in accordance with each pulse of the increment instruction (the signal Dx) and keeping outputting the data value stored on the designated address for the time period in which each pulse of the increment instruction (the signal Dx) indicates the logic value "1".

According to the present example, the pattern generating section 10 generates, as the hold instruction (Dy), a pulse sequence including a plurality of pulses which are synchronized with the respective pulses of the increment instruction. Here, each of the pulses has a pulse width smaller than the pulse width of the corresponding pulse of the increment instruction by the duration equal to the period of the reference clock. With such configurations, the address value output from the address pointer 32 increases at the timing when the increment instruction indicates the logic value "1" and the hold instruction indicates the logic value "0". While the increment instruction is indicating the logic value "1", the address pointer 32 maintains the designation of the address value in the address information storing section 34 without a change and causes the address information storing section 34 to keep outputting the corresponding data.

Controlled in the above-described manner, the test apparatus 100 relating to the present example can generate the address signal having a desired number of pulses with the address information storing section 34 storing 1-bit data on each address thereof, similarly to the test apparatus 100 described with reference to FIG. 5. Therefore, the test apparatus 100 relating to the present example can generate the address signal for the repairing processing with the use of memories configured in the same manner as the memories in the conventional test apparatus. Additionally, the test apparatus 100 relating to the present example can generate the address signal without using the down counter and the like. Which is to say, the test apparatus 100 relating to the present example can easily generate the address signal for the repairing processing based on the configuration of the conventional test apparatus.

Figure 10:
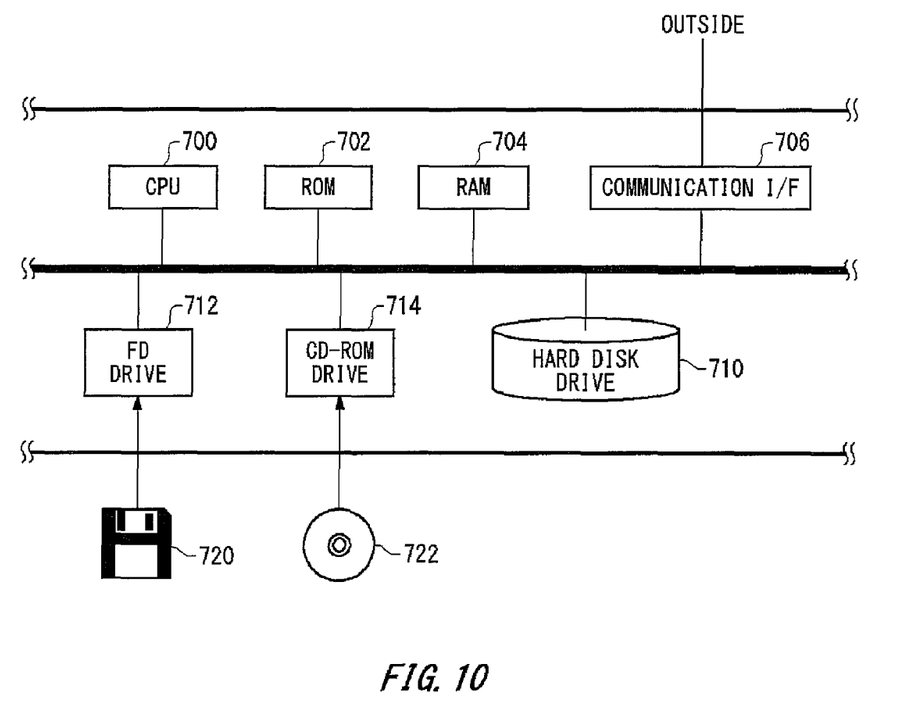
FIG. 10 illustrates an exemplary configuration of a computer 300 configured to control the test apparatus 100.

FIG. 10 illustrates an exemplary configuration of a computer 300 configured to control the test apparatus 100. According to the present example, the computer 300 stores thereon programs to cause the test apparatus 100 to function as the test apparatus 100 described with reference to FIGS. 1 to 9. Alternatively, the computer 300 itself may function as the test apparatus 100.

The computer 300 includes therein a CPU 700, a ROM 702, a RAM 704, a communication interface 706, a hard disk drive 710, a flexible disk drive 712, and a CD-ROM drive 714. The CPU 700 operates in accordance with the programs stored on the ROM 702, RAM 704, hard disk drive 710, flexible disk 720 and/or CD-ROM 722.

For example, the programs, designed to cause the test apparatus 100 to function, cause the test apparatus 100 to function as the pattern generating section 10 and the test board 12 which are described with reference to FIG. 1. Additionally, the programs cause the test board 12 to function as the timing generating section 14, waveform shaping section 16, address selecting section 18, judging section 20, fail memory 22, and first address generating section 30 described with reference to FIG. 1.

The communication interface 706 communicates with the respective constituents of the test apparatus 100, so as to receive information indicating the states of the respective constituents and transmit control signals to control the respective constituents. The hard disk drive 710, ROM 702 or RAM 704, which is shown as an exemplary storage device, stores thereon setting information, the programs to cause the CPU 700 to operate, and programs to cause the test apparatus 100 to function, for example. The programs may be alternatively stored on a recording medium such as the flexible disk 720 and CD-ROM 722.

When the programs are stored on the flexible disk 720, the flexible disk drive 712 reads the programs from the flexible disk 720 and supplies the read programs to the CPU 700. When the programs are stored on the CD-ROM 722, the CD-ROM drive. 714 reads the programs from the CD-ROM 722 and supplies the read programs to the CPU 700.

The programs may be read, from the recording medium, directly to the RAM to be executed, or may be first installed in the hard disk drive 710 and then read from the hard disk drive 710 to the RAM 704 to be executed. The programs may be stored on a single recording medium or a plurality of recording media. The programs stored on the recording medium may cooperate with the operating system to provide the respective functions. For example, the programs may request the operating system to perform some or all of the functions, and provide the functions based on the responses from the operating system.

The recording medium to store thereon the programs may be, for example, an optical storage medium such as DVD and PD, a magnet-optical storage medium such as MD, a tape medium, a magnet recording medium, a semiconductor memory such as an IC card and a miniature card, in addition to a flexible disk and a CD-ROM. The recording medium may be a storage device such as a hard disk or RAM which is provided in a server system connected to a dedicated communication network or the Internet.

Although some aspects of the present invention have been described by way of exemplary embodiments, it should be understood that those skilled in the art might make many changes and substitutions without departing from the spirit and the scope of the present invention which is defined only by the appended claims.

What is claimed is:

1. A test apparatus for testing and repairing a memory under test that is addressable by the number of pulses of an address signal supplied thereto, the test apparatus comprising:
    a pattern generating section that generates writing data to be written into the memory under test,
    wherein, when the test apparatus tests an address of the memory under test, the writing data is test data,
    wherein, when the test apparatus repairs a defective address of the memory under test, the writing data is repairing data, and
    wherein the pattern generating section comprises a second address generating section that generates an address signal that sequentially designates each address of the memory under test to which the test data is to be written;
    a first address generating section that stores thereon address information indicating the defective address of the memory under test to which the repairing data is to be written and generates an address signal based on the stored address information;
    an address selecting section that, when the test apparatus tests an address of the memory under test, selects the address signal generated by the second address generating section and, when the test apparatus repairs the defective address of the memory under test, selects the address signal generated by the first address generating section; and
    a waveform shaping section that shapes the selected address signal by outputting one or more pulses at a predetermined time interval and provides the shaped address signal to the memory under test.

2. The test apparatus as set forth in claim 1, wherein the first address generating section comprises:
    an address information storing section that stores thereon the address information indicating an expected number of pulses of the address signal;
    a down counter that subtracts, at a predetermined time interval, a first predetermined value from the number of pulses indicated by the address information received from the address information storing section; and
    a signal output section that outputs a pulse signal having a pulse width substantially equal to a time period from when the down counter receives the address information to when a result of the subtraction done by the down counter reaches a second predetermined value,
the waveform shaping section generates the one or more pulses at the predetermined time interval during the time period for which the pulse signal indicates a predetermined logic value.

3. The test apparatus as set forth in claim 1, wherein when the test apparatus writes repairing data into a defective address in the memory under test, the defective address of the memory under test to which the repairing data is to be written is designated by the number of the pulses of the address signal supplied to the memory under test.

4. The test apparatus as set forth in claim 1, further comprising a judging section that reads the test data written into each address of the memory under test, and judges whether each address is acceptable based on the read data, wherein the address information storing section stores thereon the address information indicating an address judged by the judging section to be the defective address.

5. The test apparatus as set forth in claim 1, wherein the first address generating section comprises:
    an address information storing section that stores thereon binary data indicating an expected number of pulses of the address signal; and
    an address pointer that maintains designation of each of bit values of the binary data for a time period determined in accordance with a bit position of the designated bit value, so as to cause the address information storing section to keep outputting the designated bit value for the time period, and
the waveform shaping section shapes the selected address signal by outputting the one or more pulses at the predetermined time interval during the time period in which a signal output from the address information storing section indicates a predetermined logic value.

6. The test apparatus as set forth in claim 5, wherein the address information storing section stores each of the bit values of the binary data at a different address thereof, and
the address pointer maintains designation of each address of the address information storing section for a time period determined in accordance with a bit position of a bit value stored on the designated address, so as to cause the address information storing section to keep outputting the bit value stored on the designated address for the time period.

7. The test apparatus as set forth in claim 6, wherein the address pointer comprises:
    a clock terminal that receives a reference clock;

a hold terminal that receives a hold instruction to cause the address pointer to hold designation of an address number; and an increment terminal that receives an increment instruction that, on condition that the address pointer does not receive the hold instruction, sequentially increases the designated address number in accordance with the reference clock, and the test apparatus further comprises:

an increment instruction generating section that supplies, to the address pointer as the increment instruction, a pulse sequence including a plurality of pulses, each of which has a pulse width equal to an integral multiple of a period of the reference clock, the pulse width of each of the plurality of pulses being twice a pulse width of an immediately preceding pulse; and a hold instruction generating section that supplies, to the address pointer as the hold instruction, a pulse sequence including a plurality of pulses respectively synchronized with the plurality of pulses of the increment instruction, each of the plurality of pulses having a pulse width smaller than a pulse width of a corresponding one of the plurality of pulses of the increment instruction by a duration equal to the period of the reference clock.

8. A test method for testing and repairing a memory under test that is addressable by the number of pulses of an address signal supplied thereto, the test method comprising:

generating writing data to be written into the memory under test, wherein, when the test apparatus tests an address of the memory under test, the writing data is test data, wherein, when the test apparatus repairs a defective address of the memory under test, the writing data is repairing data;

generating a test address signal that sequentially designates each address of the memory under test to which the test data is to be written;

storing address information indicating the defective address of the memory under test to which the repairing data is to be written;

generating an repair address signal based on the stored address information;

selecting, when the test apparatus tests an address of the memory under test, the test address signal and, when the test apparatus repairs the defective address of the memory under test, the repair address signal;

shaping the selected address signal by outputting one or more pulses at a predetermined time interval; and providing the shaped address signal to the memory under test.

9. A computer program product for use with a test apparatus that tests and repairs a memory under test that is addressable by the number of pulses of an address signal supplied thereto, the computer program product having computer instructions, recorded on a computer readable medium, for enabling a computer to execute the computer instructions to cause the test apparatus to function as:

a pattern generating section that generates writing data to be written into the memory under test, wherein, when the test apparatus tests an address of the memory under test, the writing data is test data, wherein, when the test apparatus repairs a defective address of the memory under test, the writing data is repairing data, and wherein the pattern generating section comprises a second address generating section that generates an address signal that sequentially designates each address of the memory under test to which the test data is to be written;

a first address generating section that stores thereon address information indicating the defective address of the memory under test to which the repairing data is to be written and generates an address signal based on the stored address information;

an address selecting section that, when the test apparatus tests an address of the memory under test, selects the address signal generated by the second address generating section and, when the test apparatus repairs the defective address of the memory under test, selects the address signal generated by the first address generating section; and a waveform shaping section that shapes the selected address signal by outputting one or more pulses at a predetermined time interval and provides the shaped address signal to the memory under test.

10. A recording medium storing thereon a program for use with a test apparatus that tests and repairs a memory under test that is addressable by the number of pulses of an address signal supplied thereto, the program causing the test apparatus to function as:

a pattern generating section that generates writing data to be written into the memory under test, wherein, when the test apparatus tests an address of the memory under test, the writing data is test data, wherein, when the test apparatus repairs a defective address of the memory under test, the writing data is repairing data, and wherein the pattern generating section comprises a second address generating section that generates an address signal that sequentially designates each address of the memory under test to which the test data is to be written;

a first address generating section that stores thereon address information indicating the defective address of the memory under test to which the repairing data is to be written and generates an address signal based on the stored address information;

an address selecting section that, when the test apparatus tests an address of the memory under test, selects the address signal generated by the second address generating section and, when the test apparatus repairs the defective address of the memory under test, selects the address signal generated by the first address generating section; and a waveform shaping section that shapes the selected address signal by outputting one or more pulses at a predetermined time interval and provides the shaped address signal to the memory under test.

* * * * *